United States Patent

Pilling et al.

[11] Patent Number: 5,808,343
[45] Date of Patent: *Sep. 15, 1998

[54] INPUT STRUCTURE FOR DIGITAL INTEGRATED CIRCUITS

[75] Inventors: David J. Pilling, Los Altos Hills; Raymond M. Chu, Saratoga, both of Calif.

[73] Assignee: Integrated Device Technology, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 716,961

[22] Filed: Sep. 20, 1996

[51] Int. Cl.⁶ .............................. H01L 23/62; H01L 29/00
[52] U.S. Cl. ...................... 257/358; 257/363; 257/503; 257/536
[58] Field of Search .................... 257/503, 528, 257/536, 355, 356, 358, 363, 546, 547

[56] References Cited

U.S. PATENT DOCUMENTS

| | | |
|---|---|---|
| 4,385,337 | 5/1983 | Asano et al. ............................ 257/363 |
| 4,833,350 | 5/1989 | Frisch ...................................... 307/475 |
| 5,159,518 | 10/1992 | Roy ............................................ 361/56 |
| 5,341,018 | 8/1994 | Echigoya et al. ....................... 257/503 |
| 5,477,407 | 12/1995 | Kobayashi et al. ..................... 257/355 |
| 5,497,337 | 3/1996 | Ponnapalli et al. ..................... 364/489 |
| 5,565,698 | 10/1996 | Obermeier ............................... 257/355 |
| 5,602,404 | 2/1997 | Chen et al. .............................. 257/356 |
| 5,610,426 | 3/1997 | Asai et al. ............................... 257/355 |
| 5,640,036 | 6/1997 | Lee et al. ................................. 257/356 |
| 5,641,697 | 6/1997 | Iwanami .................................. 257/358 |

FOREIGN PATENT DOCUMENTS

| | | | |
|---|---|---|---|
| 357204167 | 12/1982 | Japan .................................... 257/363 |
| 358165369 | 9/1983 | Japan .................................... 257/356 |
| 362150875 | 7/1987 | Japan .................................... 257/546 |

*Primary Examiner*—Ngân V. Ngô
*Attorney, Agent, or Firm*—Skjerven, Morrill, MacPherson, Franklin & Friel

[57] ABSTRACT

Integrated circuit access times are reduced by an input structure in which input signals are routed through a low resistance path from the input pad directly to the interior of the integrated circuit without using an input driver.

5 Claims, 3 Drawing Sheets

INPUT STRUCTURE FOR DIGITAL INTEGRATED CIRCUITS

FIELD OF THE INVENTION

This invention relates to semiconductor digital integrated circuits, and particularly relates to input structure by which input signals, such as address, data and clock signals, enter such integrated circuits.

BACKGROUND OF THE INVENTION

In MOS (metal-oxide-semiconductor) digital integrated circuits, the conventional input structure includes, for each input, a bond pad and associated electrostatic discharge protection circuit. The bond pad is located in close proximity to and connected to a line driver (buffer). The output of the buffer is connected to an interior circuit within the chip.

A conventional integrated circuit input structure 10 is shown in schematic form in FIG. 1. An input bond pad 11 is connected to electrostatic discharge protection circuits 15A and 15B and to driver buffer 12. The buffer 12, located in proximity to the bond pad 10, is connected by a conductive lead 13 to an internal circuit 14. The resistor 13A represents the resistance inherent to the conductive material of lead 13. The capacitor 13B, shown distributed along the length of lead 13, represents the parasitic capacitance between lead 13 and the underlying dielectric layer (not shown). The driver 12 charges and discharges the parasitic capacitance 13B and the capacitance (not shown) of the internal circuit 14 through the input lead resistance 13A. An output driver (buffer) on another chip charges and discharges the capacitances (not shown) of the input bond pad 11, the input protection circuits 15A and 15B, and the input driver 12.

The input driver 12, located in proximity to the bond pad 11, has heretofore been considered essential to minimize the signal delays associated with charging and discharging the parasitic capacitance 13B and the capacitance of circuit 14 through the resistance 13A of lead 13.

SUMMARY OF THE INVENTION

In accordance with the present invention, a novel input structure, or input signal path, is provided for use in MOS digital integrated circuits such as microprocessors and memories. In this structure, an input bond pad (or other input terminal) and associated electrostatic discharge protection structure are as before. However, the bond pad is connected, not as in the prior art to an input buffer, but rather to an input resistor. The input resistor, during normal circuit operation, attenuates spikes on the input signal and also forces the electrostatic discharge protection structure into action to provide electrostatic discharge protection for components within the chip and to provide latch-up protection. In addition the input resistor serves, during second metal deposition, to protect the circuit from damage caused by charges originating from the metal deposition process. The conductive path or input lead, that carries the input signal from the input resistor to an internal circuit or circuits within the chip, is implemented with minimum resistance and capacitance so as to minimize signal delays. Thus, with the input resistor replacing the prior art input buffer and with the resistance and capacitance of the input lead minimized, the input signal delay times and related overall circuit performance are improved.

DETAILED DESCRIPTION OF AN EMBODIMENT OF THE INVENTION

Figure 2A:
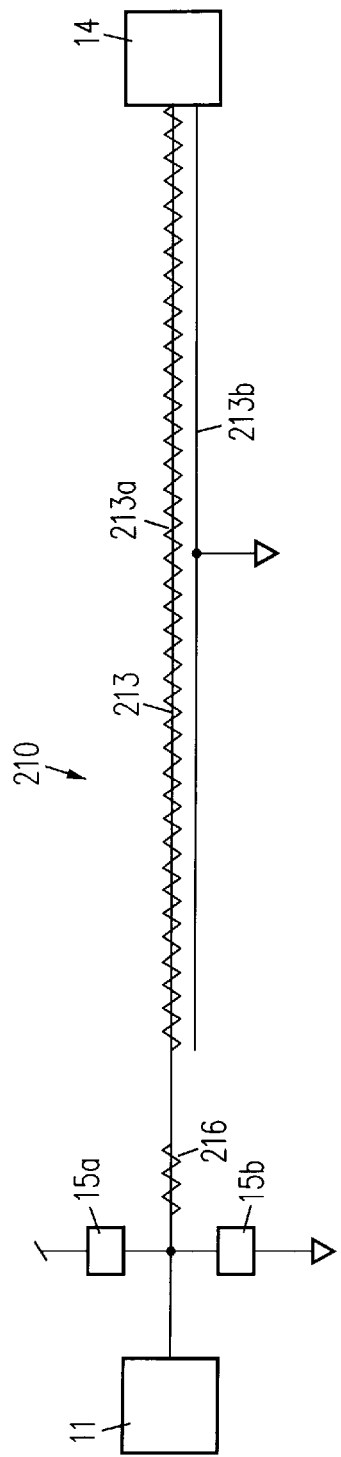
FIG. 2A a schematic representation of an input structure in accordance with the present invention.

FIG. 2A shows a schematic drawing of an integrated circuit input structure 210 in accordance with the present invention. This structure is for use in receiving input signals such as address, data and clock signals. An input bond pad 11 is connected to electrostatic discharge protection circuits 15A and 15B and to one end of input resistor 216, the protection circuits 15A and 15B and resistor 216 being in proximity to the bond pad 11. The other end of resistor 216 is connected to an input lead 213 which is connected to an internal circuit 14. The internal circuit 14 may be any appropriate circuit for use with the input signals. The internal circuit 14 may be a distribution circuit for distributing the input signal to multiple destinations. Alternatively, the internal circuit 14 may be a phase locked loop used in an arrangement to minimize skew in a signal distributed to multiple on-chip destinations. The internal circuit 14 may be quite far away from the input resistor 216 and may be located at the center of the chip. The resistance 213A of the input lead 213 and the parasitic capacitance 213B of input lead 213 are shown distributed along the length of lead 213.

Figure 2B:
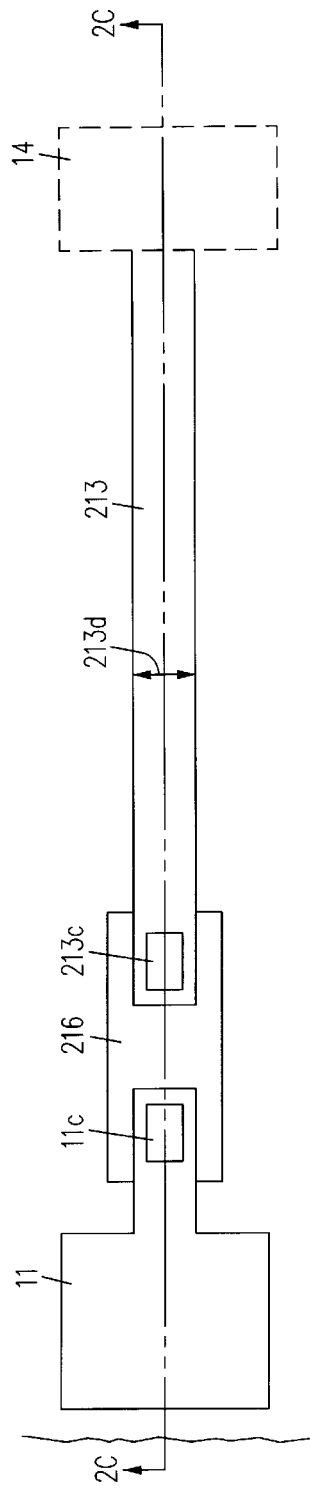
FIG. 2B shows a plan view of the input structure of FIG. 2A as laid out in an integrated circuit.
Figure 2C:
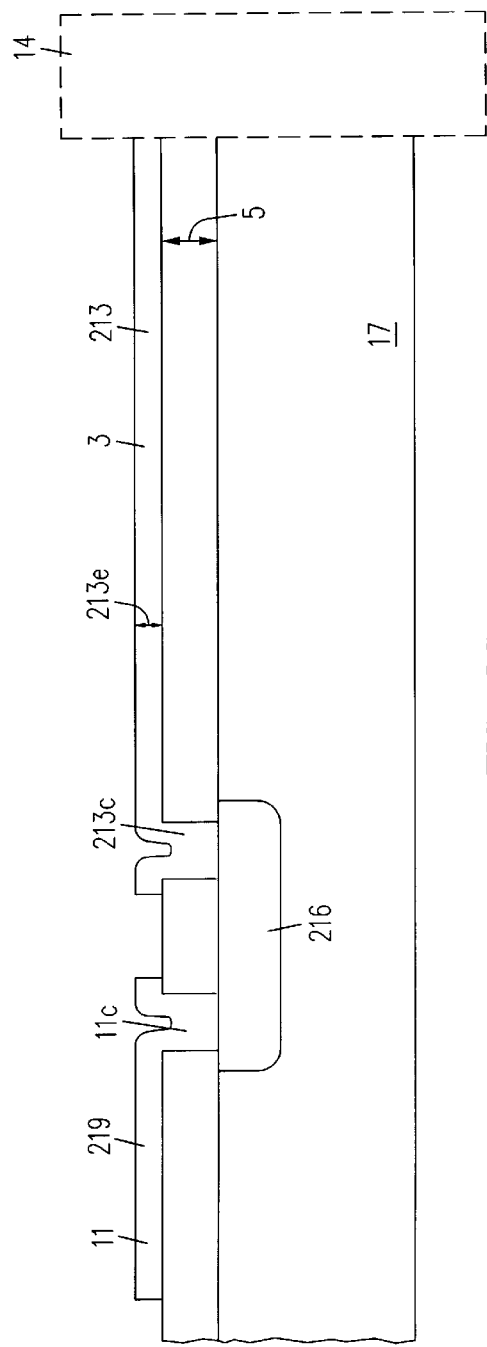
FIG. 2C shows a cross section view of the input structure taken at the line 2C–2C in FIG. 2B.

In FIGS. 2B and 2C the input protection circuits are omitted for clarity. In these figures interior circuit 14 is shown by a dashed outline to indicate that details of the interior circuit 14 are omitted.

FIG. 2B shows the structure of FIG. 2A as laid out in an integrated circuit. In FIG. 2B, resistor 216 is shown having two contact areas 213C and 11C. The input lead 213 is shown connected to resistor 216 at contact 213C. The bond pad 11 is connected to the resistor 216 at contact 11C.

FIG. 2C shows a cross section, taken at 2C–2C, of the structure shown in plan view in FIG. 2B. In FIG. 2C the resistor 216 is shown as a diffused region bounded by a pn junction 217 in the semiconductor substrate 17. The bond pad 11 is shown as a portion of metal layer 219 extending into contact 11C. Metal layer 219 is formed in a standard manner on the top surface of region 5 of the wafer and is then patterned into bonding pads, such as pad 11, contacts such as contacts 11C and 213C to input resistor 216 and input lead 213. Region 5 is made up of a number of layers of dielectric and conductive materials. The top surface of region 5 is formed from a dielectric material which has a thickness selected in accordance with this invention to reduce the capacitance associated with lead 213. The input lead 213 is shown also as a portion of metal layer 219 and extending into contact 213C. The bond pad 11 portion and the lead 213 portion of metal layer 219 are shown on top of region 5 and are insulated by region 5 from the substrate 17 and from other conductive regions, not shown. For clarity in FIG. 2C, various layers within region 5 are not shown, layers such as metal layers, polysilicon layers and dielectric layers.

It is a feature of the present invention, when implemented in an integrated circuit having multiple metal levels, that the RC product of lead 213 is minimized by using the most suitable of the metal levels. The first metal level (the first deposited) is closer to the substrate 17 than the second metal level or the third metal (if present) and has therefore a higher parasitic capacitance per unit area. The first metal level is also likely to be thinner than second or third metal, thus requiring a greater footprint and hence a greater parasitic capacitance. Thus the first metal level in a multi-level structure is generally not the most suitable.

The second and third (if present) metal levels are more suitable for minimizing the RC product of lead 213 in that they are further removed from the substrate 17. The second and third metal levels are also generally thicker than the first (since surface topography is less critical), thus allowing the lead 213 to have a smaller footprint and, since capacitance is proportional to area, a smaller parasitic capacitance.

The final metal level, be it first level, second level or third level, may also be formed of very low resistivity material such as aluminum (or an aluminum alloy such as aluminum-silicon-copper) which imposes an upper temperature limit on subsequent processes. These aluminum based materials can be used for the uppermost or final metal level since subsequent processes can be performed within the temperature limit.

The final metal level may also allow more freedom to make the leads 213 wider since the lead density (i.e. the number of leads per unit area) is generally less in the final level.

Figure 1:
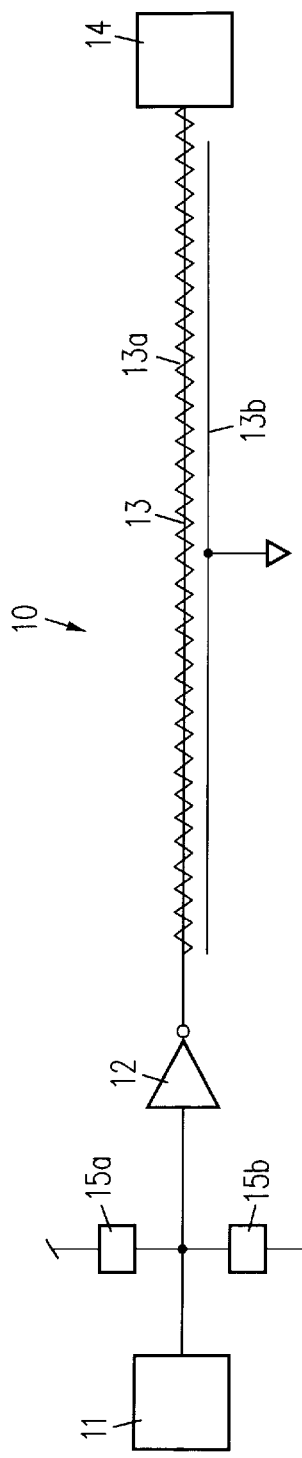
FIG. 1 shows a schematic representation of a prior art input structure.

The reduction of resistance 213A and capacitance 213B of input lead 213, achieved by use of the most suitable metal level as described above, when combined with the reduction of the input capacitance of the static discharge protection circuits 15A and 15B and of the internal circuit 14 (the capacitance of these parts having decreased over time as their dimensions and area have decreased) allows removal of the prior art input buffer 12 (FIG. 1) and allows the internal circuit 14 to be driven directly by the external source of the input signal i.e. by an output driver on another chip.

The input resistor 216 is added in series between input pad 11 and the lead 213 to prevent power spikes in the input signal at input pad 11 from reaching the internal circuit 14. The input resistor 216 also serves to activate the static discharge circuit thereby protecting components on the chip and reducing the tendency to latch-up. In addition, the input resistor 216 provides component protection during metal deposition when large excess charges originating in the deposition process would otherwise destroy pn junctions. The input resistor 216 is shown located adjacent to an input bond pad 11; however, the input resistor 216 may be located elsewhere between the input pad 11 and the internal circuit 14.

Figure 3:
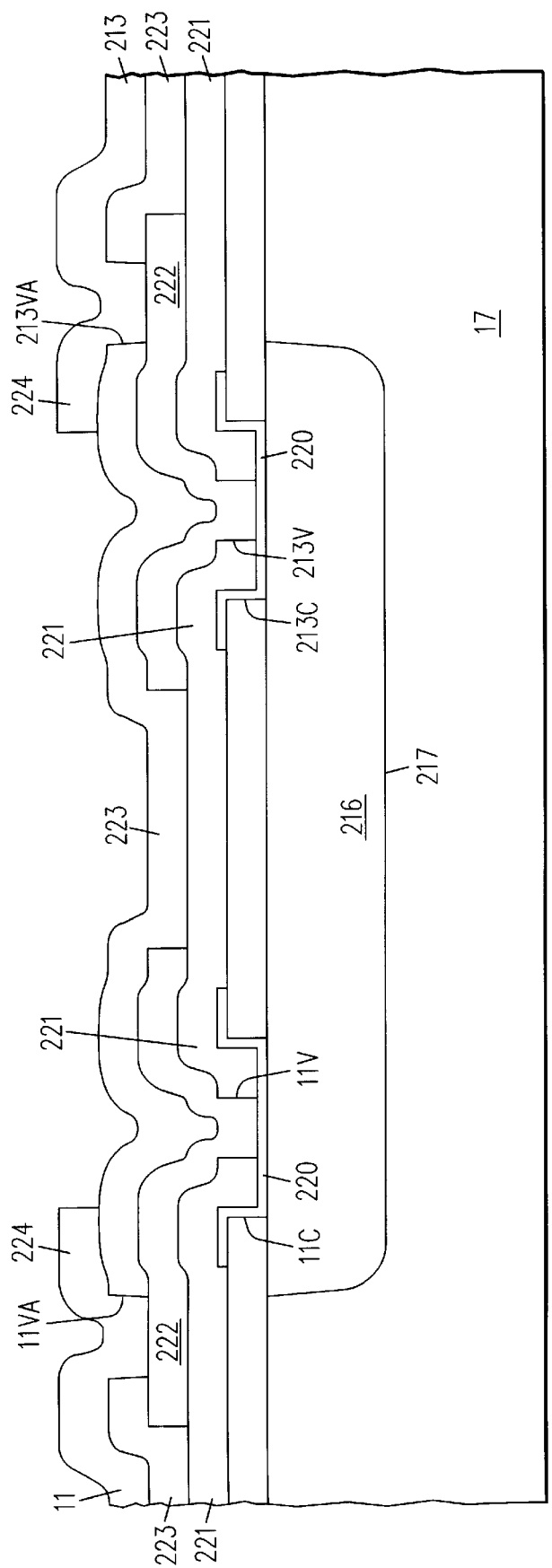
FIG. 3 shows a cross section of an input resistor with polysilicon contacts for use in the present invention.

FIG. 3 shows an input resistor 216 in which polysilicon is optionally used to prevent aluminum from spiking through the diffused resistor to substrate junction 217. The resistor 216 is in this case a diffused resistor in the semiconductor substrate 17. Portions of a polysilicon layer 220 protect the substrate silicon within the contact areas 11C and 213C. An insulating layer 221 such as thermally grown silicon dioxide overlays the polysilicon and has via openings at 11V and 213V. A first metal level 222, typically formed using an alloy of aluminum, contacts the polysilicon 220 within the vias 11V and 213V. An insulating layer 223, such as CVD silicon dioxide, overlays first metal level 222. Vias 11VA and 213VA expose portions of the first metal level 222. Second metal level 224 contacts the first metal level 222 in the vias 11VA and 213VA. In this example the input lead 213 and the bond pad 11 are in the second metal level 224.

The diffused resistor with optional polysilicon protection as just described is implemented in a typical case with the following values. The input resistor value is typically about 200 ohms, the sheet resistance being typically between 5 and 70 ohms per square. The resistor value is determined by matching the dynamic impedance of the integrated circuit to the characteristic impedance of the package and the lines leading up to package. The diffused resistor 216 may be either N or P type and the resistor dopant may be introduced by any suitable means. The polysilicon 220 is typically 1000 to 2000 angstroms thick. The first metal 222 is typically aluminum or an aluminum alloy such as aluminum-silicon-copper and is typically 6000 angstroms thick with sheet resistance of 50 to 100 milliohms. The second metal 224 is typically aluminum or an aluminum alloy such as aluminum-silicon-copper and is typically 10,000 Angstroms thick with sheet resistance of 25 to 50 milliohms. The lead width 213D in FIG. 2B is typically about 10 microns.

The input resistor can be a diffused resistor in the semiconductor substrate or it can be a thin film resistor made of polysilicon or of any other suitable material. The metal levels can be of aluminum or of any other suitable metal or alloy or of any other suitable conductive material such as a metal silicide.

The embodiments of the invention described herein are illustrative and the claims are intended to encompass variations obvious to those of ordinary skill in the art.

We claim:

1. An integrated circuit comprising:
   an input structure for conducting an input signal to an interior circuit within the integrated circuit, said input structure comprising:
   an input terminal including a bond pad;
   an input resistor formed to prevent power spikes at the input terminal from reaching the interior circuit; and
   a conductive lead, in series with said input resistor, said conductive lead and said input resistor connecting said input terminal to said interior circuit without a buffer in series with said conductive lead and said input resistor, said conductive lead being formed as part of a conductive layer, said conductive layer residing above one or more other conductive layers, said conductive layer having a thickness greater than the thickness of each of said one or more other conductive layers and having a capacitance less than what a conductive lead formed in on said one or more other conductive layers of the same width and length would have;
   wherein said conductive lead and input resistor together protect the interior circuit from damage due to voltage spikes and carry the input signals received by said input terminal to the interior circuit with minimum resistance and capacitance so as to minimize signal delays.

2. The integrated circuit of claim 1 wherein said interior circuit is located near the center of the integrated circuit.

3. The integrated circuit of claim 1 wherein said input resistor has a resistance of about 200 ohms.

4. The integrated circuit of claim 1 comprising a first metal level and a second metal level wherein a portion of said conductive lead is in said second metal level.

5. The integrated circuit of claim 1 comprising a first metal level, a second metal and a third metal level, wherein a portion of said conductive lead is in said third metal level.

* * * * *